United States Patent
Kuss et al.

(10) Patent No.: US 7,995,280 B2
(45) Date of Patent: Aug. 9, 2011

(54) PROJECTION EXPOSURE SYSTEM, BEAM DELIVERY SYSTEM AND METHOD OF GENERATING A BEAM OF LIGHT

(75) Inventors: Matthias Kuss, Sinningen (DE); Damian Fiolka, Oberkochen (DE); Gerd Reisinger, Oberkochen (DE); Manfred Maul, Aalen (DE); Vladimir Davydenko, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1082 days.

(21) Appl. No.: 11/792,099

(22) PCT Filed: Dec. 1, 2005

(86) PCT No.: PCT/EP2005/012857
§ 371 (c)(1),
(2), (4) Date: Jun. 1, 2007

(87) PCT Pub. No.: WO2006/058754
PCT Pub. Date: Jun. 8, 2006

(65) Prior Publication Data
US 2008/0225921 A1    Sep. 18, 2008

Related U.S. Application Data

(60) Provisional application No. 60/632,634, filed on Dec. 1, 2004, provisional application No. 60/676,263, filed on Apr. 28, 2005.

(51) Int. Cl.
*G02B 27/14* (2006.01)
(52) U.S. Cl. .................................. 359/637
(58) Field of Classification Search .......... 359/637
See application file for complete search history.

(56) References Cited

U.S. PATENT DOCUMENTS
4,619,508 A    10/1986   Shibuya et al.
(Continued)

FOREIGN PATENT DOCUMENTS
DE    199 31 751    1/2001
(Continued)

OTHER PUBLICATIONS

International Search Report for International Application No. PCT/EP2005/012857, dated Jun. 7, 2006.

(Continued)

*Primary Examiner* — Ricky L Mack
*Assistant Examiner* — Vipin M Patel
(74) *Attorney, Agent, or Firm* — Fish & Richardson P.C.

(57)    ABSTRACT

A beam delivery system of a projection exposure system comprises a laser generating a beam of laser light from a plurality of longitudinal laser modes in a cavity, wherein light generated by a single longitudinal laser mode has an average line width $\lambda_{lat}$, wherein the laser light of the beam has, at each of respective lateral positions of the beam, a second line width $\lambda_{lat}$ corresponding to lateral laser modes, and wherein the laser light of the beam has, when averaged over a whole cross section thereof, a line width $\lambda_b$ corresponding to plural lateral laser modes, and wherein $\lambda_m < \lambda_{lat} < \lambda_b$, and wherein an optical delay apparatus disposed in the beam provides an optical path difference $\Delta l$, wherein $$0.8 \cdot \frac{\lambda_0^2}{(2 \cdot \Delta \lambda_l)} < \Delta l < 1.8 \cdot \frac{\lambda_0^2}{(2 \cdot \Delta \lambda_l)},$$

wherein $\lambda_0$ is an average wavelength of the light of the first beam of laser light, and $\Delta\lambda_{lat}$ represents the second line width.

9 Claims, 9 Drawing Sheets

U.S. PATENT DOCUMENTS

| | | | |
|---|---|---|---|
| 5,048,926 A | | 9/1991 | Tanimoto |
| 5,253,110 A | | 10/1993 | Ichihara et al. |
| 5,343,489 A | | 8/1994 | Wangler |
| 5,519,802 A | * | 5/1996 | Field et al. .................. 385/129 |
| 5,631,721 A | | 5/1997 | Stanton et al. |
| 5,710,620 A | | 1/1998 | Taniguchi |
| 5,926,257 A | | 7/1999 | Mizouchi |
| 6,191,887 B1 | | 2/2001 | Michaloski et al. |
| 6,238,063 B1 | | 5/2001 | Tanitsu et al. |
| 6,285,443 B1 | | 9/2001 | Wangler et al. |
| 6,470,122 B1 | | 10/2002 | Doumuki |
| 6,587,182 B1 | | 7/2003 | Goto |
| 6,597,430 B1 | | 7/2003 | Nishi et al. |
| 6,657,787 B1 | | 12/2003 | Otaki |
| 6,898,216 B1 | * | 5/2005 | Kleinschmidt .................. 372/9 |
| 6,996,141 B1 | | 2/2006 | Schuster et al. |
| 2003/0071204 A1 | | 4/2003 | Sandstrom et al. |
| 2003/0090638 A1 | | 5/2003 | Koehler et al. |

FOREIGN PATENT DOCUMENTS

| | | |
|---|---|---|
| EP | 0 959 378 | 11/1999 |
| EP | 1 079 277 | 2/2001 |
| JP | 2001/060550 | 3/2001 |
| WO | WO 03/023833 | 3/2003 |

OTHER PUBLICATIONS

Written Opinion of the International Searching Authority for International Application No. PCT/EP2005/012857, dated Jun. 7, 2006.

* cited by examiner

PROJECTION EXPOSURE SYSTEM, BEAM DELIVERY SYSTEM AND METHOD OF GENERATING A BEAM OF LIGHT

CROSS REFERENCE TO RELATED APPLICATIONS

This application is the National Phase application of International Application No. PCT/EP2005/012857, filed Dec. 1, 2005, which designates the United States and was published in English, and which further claims priority from U.S. Provisional Application No. 60/632,634, filed Dec. 1, 2004, and U.S. Provisional Application No. 60/676,263, filed Apr. 28, 2004. These applications, in their entirety, are incorporated herein by reference.

BACKGROUND OF THE INVENTION

1. Field of the Invention

The present invention relates to a method of generating a beam of light, a beam delivery system and a projection exposure system for imaging a patterning structure onto a light sensitive substrate.

2. Brief Description of Related Art

Lithographic processes are commonly used in the manufacture of miniaturized structures, such as integrated circuits, liquid crystal elements, micro-patterned structures and micro-mechanical components.

A projection exposure system used for photolithography generally comprises a projection optical system for imaging a patterning structure, commonly referred to as a reticle, onto a substrate, commonly referred to as a wafer. The substrate is coated with a photosensitive layer, commonly referred to as a resist, which is exposed with an image of the patterning structure using imaging light. The imaging light is generated by a beam delivery system illuminating the patterning structure with the imaging light.

The beam delivery system comprises a laser light source, such as an excimer laser, for producing the imaging light.

It has been observed that, due to the spatial coherence of the laser light, interferences of the laser light result in a non-homogeneous intensity of the imaging light in a plane where the patterning structure is disposed. Such non-homogeneous distribution of intensity of light, which is also known as speckle noise, may result in a reduced imaging performance of the projection exposure system.

SUMMARY OF THE INVENTION

The present invention has been accomplished taking the above problems into consideration.

Embodiments of the present invention provide a method of reducing a visibility of speckles in a projected image of a projection exposure system.

Other embodiments of the present invention provide a beam delivery system providing a beam of light having a reduced coherence as compared to laser light directly emitted from a laser of the beam delivery system.

Further embodiments of the present invention provide a projection exposure system having an improved imaging performance due to an improved homogeneity of light used for illuminating a patterning structure to be imaged.

According to an embodiment of the invention, a method of generating a beam of light, comprises: exciting a plurality of longitudinal laser modes in a cavity of a laser and combining light generated by the plurality of longitudinal laser modes to form a first beam of laser light; separating the first beam of laser light into at least one first partial beam and at least one second partial beam; and combining the at least one first partial beam and the at least one second partial beam to form a second combined beam of laser light traversing a beam shaping optics to be incident on an object plane; wherein the separating and combining includes separating light of the longitudinal laser modes into at least first light portions and second light portions and differently manipulating the separated first and second light portions. By differently manipulating first light portions and second light portions, the first and second light portions will not identically coincide in an object plane or image plane of a projection optical system, such that speckle patterns generated by the first light portions and speckle patterns generated by the second light portions will not identically coincide in the object plane or will experience an reduction due to an interference between the first and second light portions.

According to an embodiment of the invention, a laser generates a first beam of laser light, the first beam of laser light is separated into a first partial beam and a second partial beam, an optical path difference of the first partial beam is provided relative to the second partial beam, and the first and second partial beams are then combined to form a second beam of laser light. The optical path difference $\Delta l$ is greater than about $0.8 \cdot \lambda_0^2/(2\Delta\lambda_{lat})$ and less than about $1.8 \cdot \lambda_0^2/(2\Delta\lambda_{lat})$, wherein $\lambda_0$ is an average wavelength of the light generated by the laser, and $\Delta\lambda_{lat}$ is a line width of light generated from a single lateral laser mode of the laser.

According to further exemplary embodiments herein, the optical path difference $\Delta l$ is greater than about $0.85 \cdot \lambda_0^2/(2\Delta\lambda_{lat})$ and less than about $1.5 \cdot \lambda_0^2/(2\Delta\lambda_{lat})$, and the optical path difference $\Delta l$ may be greater than about $0.9 \cdot \lambda_0^2/(2\Delta\lambda_{lat})$ and less than about $1.2 \cdot \lambda_0^2/(2\Delta\lambda_{lat})$.

According to an exemplary embodiment of the invention, the combining of the first partial beam and the second partial beam is performed such that cross sections of the first and second partial beams are disposed adjacent to each other within a cross section of the combined second beam.

According to a further exemplary embodiment, plural first and second partial beams are combined such that their cross sections are alternatingly disposed within the cross section of the combined beam.

According to an exemplary embodiment, a beam path of the first partial beam is laterally displaced relative to a beam path of the second partial beam. Such displacement of the first and second partial beams relative to each other may be greater than a tenth of a distance corresponding to a width of a lateral laser mode across the cross section of the first beam of laser light, and less than the distance corresponding to the width of the lateral laser mode.

According to an embodiment of the present invention, a beam delivery system comprises a laser for generating a first beam of laser light and an optical delay apparatus disposed in a beam path of the first beam of laser light, wherein the optical delay apparatus is configured to provide an optical path difference of a first partial beam of the first beam of laser light relative to a second partial beam of the first beam of laser light, wherein the optical path difference is greater than about $0.8 \cdot \lambda_0^2/(2\Delta\lambda_{lat})$ and less than about $1.8 \cdot \lambda_0^2/(2\Delta\lambda_{lat})$.

According to an exemplary embodiment, the optical delay apparatus comprises a stack of a plurality of first plates of a transparent material, wherein the stack is disposed in the beam path of the first beam of laser light such that plural first partial beams of the first beam of laser light traverse the first plates and that plural second partial beams traverse spaces between adjacent first plates.

According to a further embodiment of the present invention, a beam delivery system comprises a laser for generating a first beam of laser light from a plurality of longitudinal laser modes in a cavity of the laser; and an optical delay apparatus disposed in a beam path of the first beam of laser light, wherein the optical delay apparatus is configured to provide an optical path difference of at least one first partial beam of the first beam of laser light relative to at least one second partial beam of the first beam of laser light; and wherein the optical delay apparatus comprises a stack of a plurality of first plates of a transparent material disposed at a distance from each other, wherein the first plates are traversed by beam paths of plural first partial beams and spaces between adjacent first plates are traversed by beam paths of plural second partial beams.

In this embodiment, the optical path difference can be greater than $1.8 \cdot \lambda^2 / (2 \Delta \lambda_{lat})$.

According to an exemplary embodiment, the first plates are each oriented substantially parallel to a direction of the light traversing the optical delay apparatus.

According to a further exemplary embodiment, second plates of transparent material are sandwiched between adjacent first plates. A length of the first plates and/or a refractive index of the material of the first plates differs from a length of the second plates and a refractive index of the material of the second plates, respectively.

According to an exemplary embodiment, the optical delay apparatus comprises a third plate of transparent material disposed in the beam path of the first beam of laser light such that surfaces of the third plate are oriented transversely to the direction of the first beam of laser light traversing the third plate. The first partial beam directly traverses the third plate, and the second partial beam is two or more times internally reflected from surfaces of the third plate to be combined with the first partial beam.

According to an exemplary embodiment, cross sections of the first beam of laser light immediately upstream of the optical delay apparatus and of the second beam of laser light immediately downstream of the optical delay apparatus are substantially the same.

According to a further embodiment of the present invention, a beam delivery system comprises a laser for generating a beam of laser light from a plurality of longitudinal laser modes in a cavity of the laser; an optical delay apparatus disposed in a beam path of the beam of laser light, wherein the optical delay apparatus comprises plural reflective surfaces arranged such that the beam path comprises a closed loop; at least one phase changing element disposed in the beam path of the closed loop, wherein the phase changing element comprises a structured phase changing surface having a plurality of projections and indentations of amplitudes of more than 100 nm.

According to an exemplary embodiment herein, lateral extensions of the projections and indentations are smaller than lateral extensions of coherent portions of laser light interacting with the phase changing surface and originating from single longitudinal laser modes in the cavity. This means that the lateral extensions of the projections and indentations are smaller than lateral extensions of coherent coherence cells of the laser light of the beam at a location of the phase changing element.

Thus, light generated by one longitudinal laser mode interacts with plural different projections and/or indentations such that wave fronts of the laser modes are changed by each interaction of the laser light with the phase changing surface occurring in each traversal of the closed loop.

According to a still further embodiment of the invention, a beam delivery system comprises a laser for generating a beam of laser light from a plurality of longitudinal laser modes in a cavity of the laser; an optical delay apparatus disposed in a beam path of the beam of laser light, wherein the optical delay apparatus comprises plural reflective surfaces arranged such that the beam path comprises a closed loop; at least one phase changing element comprising a phase changing surface disposed in the beam path of the closed loop; and a surface wave generator for generating surface acoustic waves propagating across a surface portion of the phase changing surface exposed to the beam of laser light traversing the optical delay apparatus.

The generated surface acoustic waves have an effect of generating a structured phase changing surface such that different portions of laser light generated by one single longitudinal laser mode experience different phase changes when traversing the phase changing surface.

In the above embodiments, the phase changing element has an effect of artificially increasing an effective number of modes or effective number of coherence cells of the light of a laser pulse. Thus, an increased number of independently uncorrelated speckle patterns is formed, wherein the increased number of speckle patterns superimposed in the image plane results in a reduced observable variation of light intensity in the image plane.

The laser may comprise an excimer laser, such as a KrF laser, an ArF laser and an $F_2$ laser.

According to a further exemplary embodiment, the laser comprises a line narrowing module, having optical elements, such as a prism and a reflective grating.

According to further exemplary embodiments, the beam delivery system may comprise further optical elements, such as a dispersion plate, a diffractive optical element, a refractive optical element, and others.

According to an embodiment of the present invention, a projection exposure system comprises a projection optical system for imaging an object plane into an image plane, a first mount for mounting a pattering structure in a region of the object plane, and a second mount for mounting a substrate in a region of the image plane of the projection optical system. The projection exposure system further comprises a beam delivery system as illustrated above for generating imaging light for illumination of the object plane.

According to a further embodiment of the present invention, a projection exposure system comprises a beam delivery system including a laser for generating a beam of laser light from a plurality of longitudinal laser modes in a cavity of the laser, and an optical delay apparatus disposed in a beam path of the beam of laser light; and a projection optical system for imaging a patterning structure disposed in an object plane of the projection optical system into an image plane thereof; wherein a beam of laser light delivered by the beam delivery system to illuminate the patterning structure disposed in the object plane has a speckle-generated intensity variation of less than 2% across the object plane.

Such reduced speckle contrast in the light illuminating the patterning structure has a particular advantage in generating a substantially uniform light intensity in the object plane of the projection optical system.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
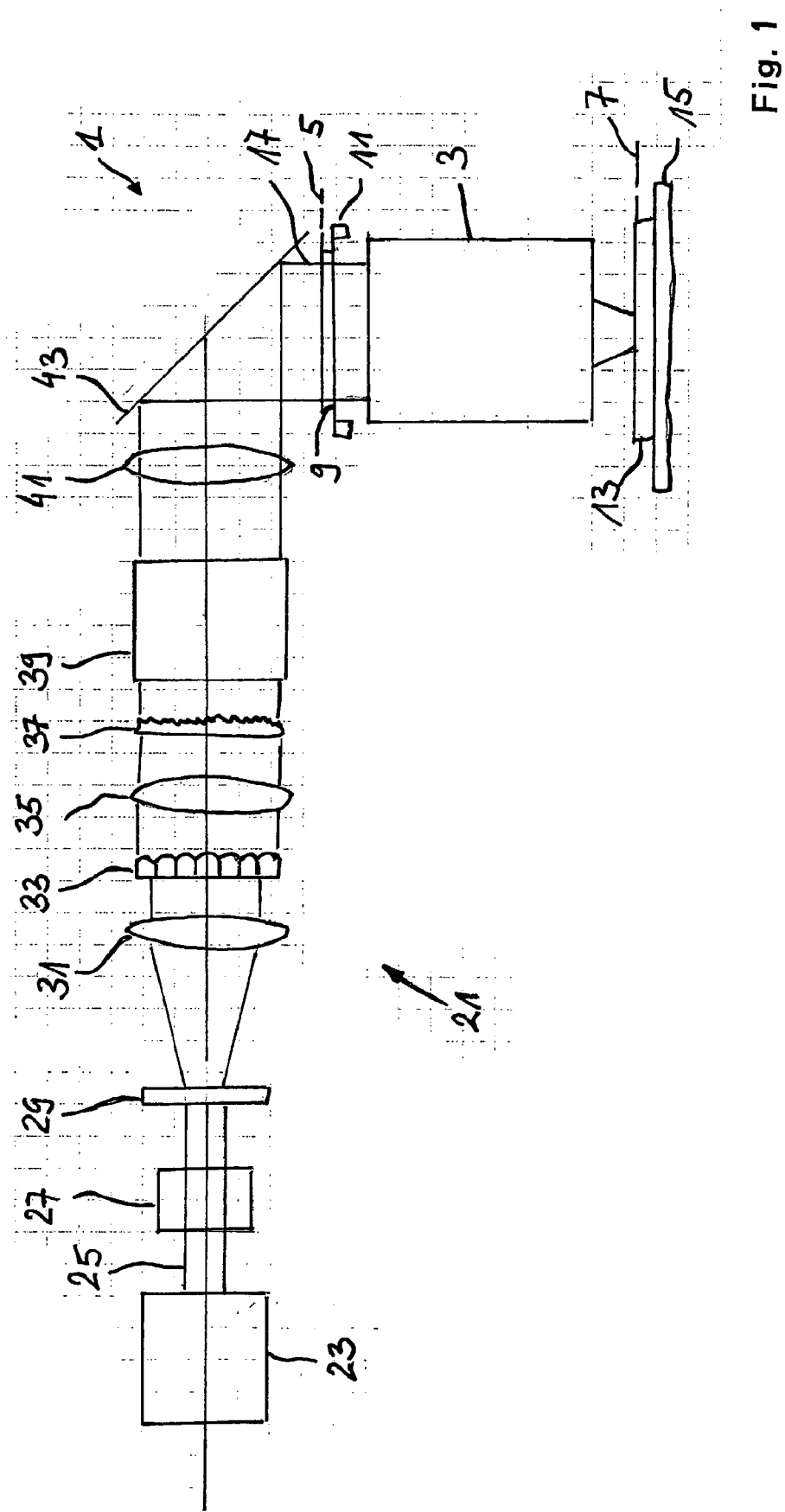
FIG. 1 is a schematic illustration of a projection exposure system according to an embodiment of the invention.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 schematically illustrates a projection exposure system 1. The projection exposure system 1 comprises a projection optical system 3 comprising a plurality of lenses or mirrors for imaging an object plane 5 of the projection optical system 3 onto an image plane 7 of the projection optical system 3. A reticle 9 is mounted by a reticle stage 11 such that a pattering structure provided by the reticle 9 is disposed in the object plane 5. A wafer 13 is mounted on a wafer stage 15 such that a light sensitive resist provided on a surface of the wafer 13 is disposed in the image plane 7. The patterning structure of the reticle 9 is illuminated by a beam 17 of imaging light generated by a beam delivery system 21.

The beam delivery system 21 comprises a laser light source 23 which is, in the present embodiment, an excimer laser, such as a KrF laser, a ArF laser and a $F_2$ laser. A beam 25 of laser light generated by the laser light source 23 traverses an optical delay apparatus 27, which will be illustrated in more detail below, for reducing a coherence of the laser light. The beam 25 then traverses a beam expander 29, which may comprise a refractive optical element, a lens system 31, a refractive optical element 33, such as a fly eye element, a further lens system 35, a diffractive plate 37, a beam homogenizing apparatus 39, such as a glass rod, and a further lens system 41 to be reflected from a mirror 43 to be incident on the reticle 9. The optical elements 29, 31, 33, 35, 37, 39 and 41 are disposed such that a light intensity of the light of the illuminating beam 17 is substantially constant across an illuminated region of the reticle 9 and has a desired angular distribution relative to the object plane 5.

The optical elements 29 to 41 illustrated so far may be of a conventional arrangement for shaping the illuminating beam 17. Further conventional arrangements of beam delivery systems are known, for example, from U.S. Pat. Nos. 6,285,443 B1, 5,926,257 and 5,710,620, the contents of which are incorporated herein by reference.

Figure 2:
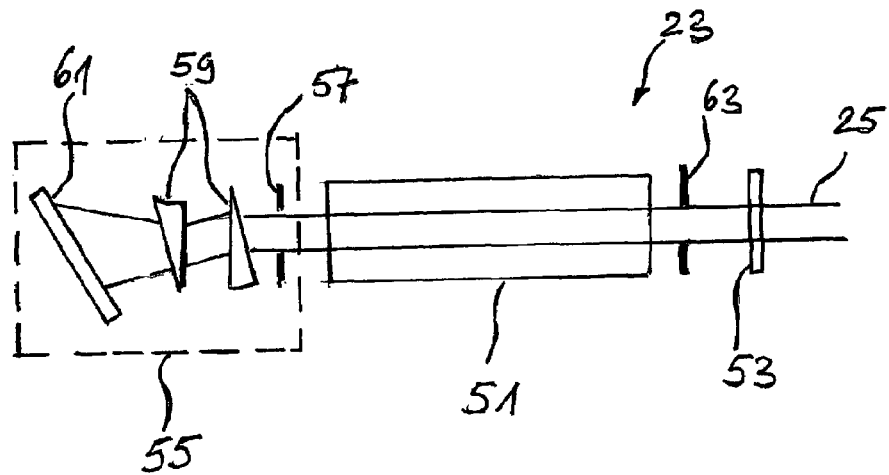
FIG. 2 is a schematic illustration of a laser of a beam delivery system of the projection exposure system shown in FIG. 1.

FIG. 2 is a schematic illustration of the excimer laser light source 23. The laser light source 23 comprises a gas chamber 51 containing a gas which is excited by high voltage pulses to produce excimer molecules emitting ultraviolet light.

The laser light source 23 further comprises a semi-transparent mirror 53 which forms an exit window of the laser which is traversed by the generated beam 25. The laser 23 further comprises a line narrowing module 55, comprising an aperture 57, two prisms 59 and a reflective grating 61. A further beam defining aperture 63 is disposed between the gas chamber 51 and the exit window 53.

Figure 3:
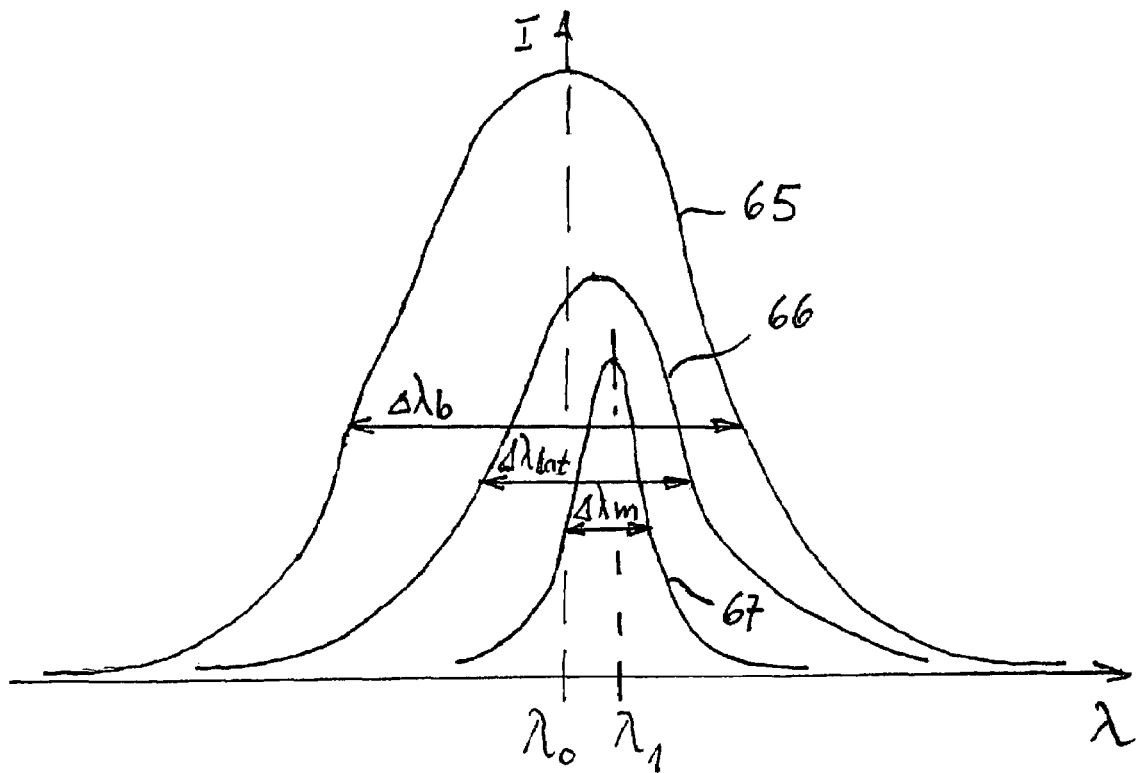
FIG. 3 is a graph illustrating line widths of laser light generated by the laser shown in FIG. 2.

The laser 23 may generate pulses of laser light at a repetition rate of, for example, 4,000 Hz to 6,000 Hz, each pulse having a duration of about 20 ns to about 150 ns. For example, 40 pulses are used for exposing each pattern onto the wafer. The laser 23 is a multi-mode laser supporting a plurality of lateral and longitudinal laser modes. An average wavelength of the light 25 emitted from the laser is $\lambda_0$. Due to the line narrowing module 55, the distribution of wavelengths about the average wavelength $\lambda_0$ is a relatively narrow line width $\Delta\lambda_b$ as illustrated in FIG. 3 which shows a line 65 representing a distribution of light intensity I in dependence of the wavelength $\lambda$. The light 25 emitted from the laser 23 originates from plural longitudinal and lateral laser modes, each having a line width smaller than the line width $\Delta\lambda_b$ of the light of beam 25. FIG. 3 shows a line 67 illustrating a spectral intensity distribution of an exemplary laser mode having a line width $\Delta\lambda_m$.

Figure 4:
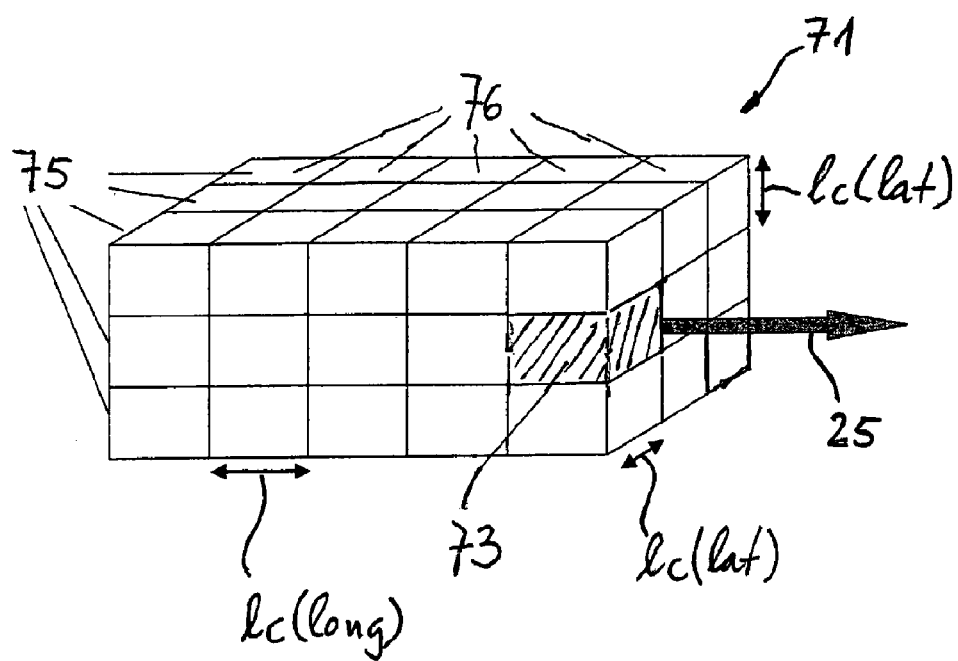
FIG. 4 is a schematic illustration of longitudinal and lateral laser modes of the laser shown in FIG. 2.

FIG. 4 is a schematic illustration of a light pulse 71 generated by laser 23. The light pulse 71 is composed of light generated from a plurality of longitudinal and lateral laser modes within chamber 51, resulting in limited volumes 73 of coherent light. In this simplified representation, each volume 73 of coherent light has an extension $l_c$(long) in the longitudinal direction and an extension $l_c$(lat) in both lateral directions. Reference numeral 75 in FIG. 4 indicates plural coherence volumes generated by different lateral modes at a same time, and reference numeral 76 indicates coherence volumes generated by different longitudinal modes at a same lateral position. The set of longitudinal modes 76 contributing to light emitted at a particular lateral position is also referred to as a lateral mode.

It should be noted that the illustration of FIG. 4 is very schematic and only for illustrative purposes. In reality, a coherence cell does not have a cubic shape as suggested by FIG. 4. Further, different coherence volumes will overlap both in longitudinal and lateral directions.

Light within a single coherence volume 73 is coherent light, such that an interference pattern may be formed from light originating from a single coherence cell 73. However, light from one coherence cell superimposed with light from a different coherence cell will not generate an interference pattern since a coherence condition is not fulfilled between different cells.

The light of the exemplary coherence cell 73 indicated as a hatched cell in FIG. 4 is assumed to have the spectral density as illustrated by line 67 in FIG. 3 at a peak wavelength $\lambda_1$. The light from other coherence cells has different peak wavelengths and may have slightly different line widths such that the combined light of all coherence cells has a spectral distribution as indicated by line 65 in FIG. 3.

Due to the geometry of the laser cavity 51 and a dispersion of the line narrowing module 55, the average wavelength of the light emitted by the laser will change across the cross section of the beam 25. It appears that a spectral distribution of the laser light generated by a single lateral mode formed of plural longitudinal modes arranged in a line parallel to the direction of the beam is narrower than the spectral distribution of the whole beam and broader than the spectral distribution of the longitudinal laser mode. Line 66 in FIG. 3 indicates a spectral distribution of an exemplary lateral laser mode.

The following Table 1 illustrates data of an exemplary KrF laser and an exemplary ArF laser.

TABLE 1

| Excimer | KrF | ArF |
|---|---|---|
| $\lambda_0$ [nm] | 248 | 193 |
| $\Delta\lambda_b$ [pm] | 0.5 | 0.5 |
| $l_b$ [cm] | 6.15 | 3.72 |
| $N_{long}$ | 80-500 | 80-500 |
| $N_{lat}$ | 100 | 100 |
| $N_{tot}$ | 8,000-50,000 | 8,000-50,000 |
| $\Delta\lambda_{lat}$ [pm] | 0.25 | 0.25 |
| $l_{lat}$ [cm] | 12.3 | 7.45 |
| $\Delta\lambda_m$ [pm] | 0.125 | 0.125 |
| $l_m$ [cm] | 24.6 | 14.9 |

$\lambda_0$ indicates the peak wavelength, $\Delta\lambda_b$ the line width of the laser light generated from the multitude of laser modes forming the beam, $N_{long}$ indicates a number of longitudinal modes, $N_{lat}$ a number of lateral modes and $N_{tot}=N_{long} \cdot N_{lat}$ a resulting total number of laser modes contributing to one pulse.

At each lateral position of the beam, the light is generated from a lateral mode comprising plural longitudinal modes. A line width of one single longitudinal mode is indicated by $\Delta\lambda_m$, and the resulting line width of a lateral mode at a particular lateral position is indicated by $\Delta\lambda_{lat}$.

$l_m$ indicates a coherence length of the light from one single laser mode calculated by the formula $l_m=\lambda_0^2/2\cdot\Delta\lambda_m$.

Table 1 further indicates comparative expressions $l_{lat}=\lambda_0^2/2\cdot\Delta\lambda_{lat}$, and $l_b=\lambda_0^2/2\cdot\Delta\lambda_b$.

The light from one single coherence cell 73 traverses the beam delivery system 21 to be incident on the object plane 5. At each location of the object plane 5, the incident light is composed of light rays having traversed different paths through the beam delivery system and having experienced slightly different optical path lengths accordingly. The coherent light from one single coherence cell 73 may thus generate an interference pattern, such as a speckle pattern, in the object plane 5. The light intensity will be modulated across the object plane, wherein a speckle contrast may be as high as 100% which means that constructive interference will take place at some locations and completely destructive interference may take place at other locations.

Since light originating from different coherence cells will not interfere with each other, each coherence cell will contribute to an independent speckle pattern in the object plane. Such independent patterns will result in an averaging of the light intensities in the object plane such that the intensity modulation is reduced by averaging by a factor $1/\sqrt{N_{tot}}$ as compared to the modulation generated by the light of one single coherence cell.

Even with such averaging, the light intensity distribution may be not sufficiently constant in the object plane 5. Therefore, the optical delay apparatus is disposed in the beam path of the imaging light.

Moreover, it should be noted that, depending on the geometry of the beam delivery system, it is possible that different longitudinal modes may generate the same speckle patterns in the object plane. In such situations, the number N of modes contributing to the averaging is determined by the lower number $N_{lat}$ of longitudinal modes rather than the total number $N_{tot}$ of modes supported by the laser.

Figure 5:
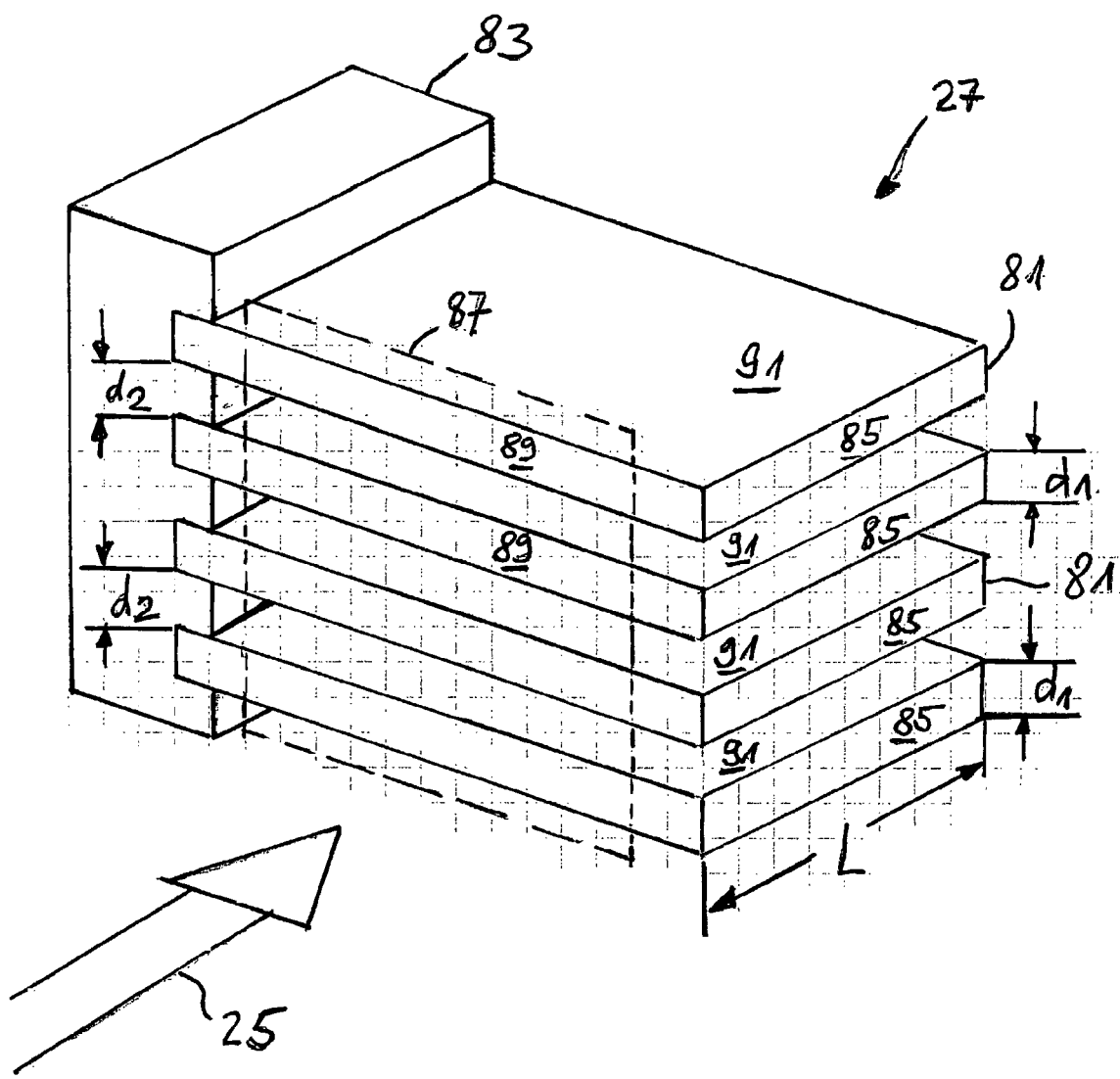
FIG. 5 is a perspective view illustrating an optical delay apparatus of the beam delivery system of the projection exposure system shown in FIG. 1.

The optical delay apparatus 27 has a function of reducing the coherence of the illuminating light and has a configuration as shown in FIG. 5. The optical delay apparatus 27 comprises a plurality of glass plates of a thickness $d_1$ which are spaced at a distance $d_2$ from each other. The glass plates 81 are mounted as a stack and fixed by two frames 83 (only one frame is shown in FIG. 5) engaging the plates 81 at lateral sides 85 thereof. A broken line 87 illustrates a cross section of beam 25 incident on front surfaces 89 of plates 81. Flat main surfaces 91 of the plates 81 extend over a length L in a direction parallel to the beam 25.

The beam 25 incident on the stack of plates 81 is separated into first partial beams traversing the plates 81 and second partial beams traversing the spaces between adjacent plates 81. The first partial beams traversing the plates 81 experience an optical delay or optical path length difference $\Delta l=(n-1)\cdot L$ relative to the second partial beams traversing the spaces between adjacent plates 81 assuming a refractive index equal to 1 for the medium between adjacent plates. The length L is chosen such that $\Delta l=\lambda_0^2/2\cdot\Delta\lambda_{lat}$. Further, a pitch $d_1+d_2$ of the stack is chosen such that it is about equal to or less than a lateral extension of a lateral laser mode in the incident beam 25. Assuming a square shaped beam cross section, the lateral extension of a lateral laser mode is about the diameter of the beam divided by $\sqrt{N_{lat}}$, wherein $\sqrt{N_{lat}}$ is the number of lateral modes of the beam. Thus, the coherent light from one single lateral laser mode is separated into at least one first partial beam experiencing the optical delay and at least one second partial beam traversing the optical delay apparatus 27 without delay.

Figure 6:
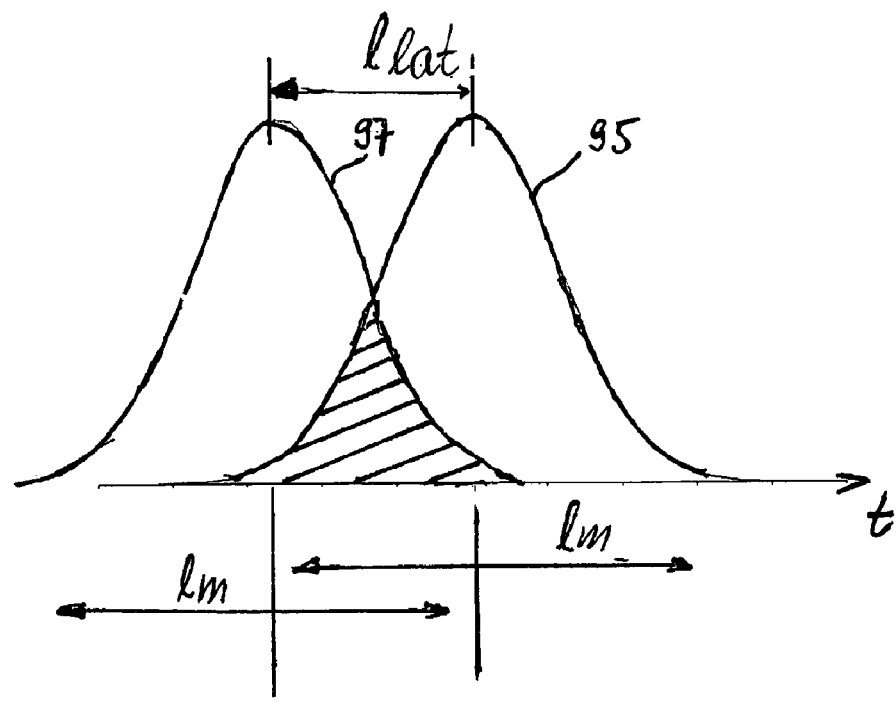
FIG. 6 is a graph illustrating an optical path difference generated by the optical delay apparatus shown in FIG. 5.

This is further illustrated in FIG. 6, in which a first line 95 represents a temporal intensity distribution of the non-delayed first partial beam and a second line 97 indicates a temporal intensity distribution of the delayed first partial beam.

It is apparent that each of the light pulses 95 and 97 may form a speckle pattern in the object plane 5, such that the delay apparatus 27 has a first effect of doubling the number of light modes capable of forming an interference pattern in the object plane. This first effect of the delay apparatus 27 reduces the intensity modulation in the object plane 5 by a factor of $1/\sqrt{2}$.

Further, due to the temporal overlap of pulses 95 and 97, light of the pulse 95 may interfere with the coherent light of the pulse 97. However, the light traversing the plates 81 not only experiences a delay by $l_{lat}$ relative to the light traversing the spaces between plates 81, the light traversing the plates further experiences a phase shift relative to the light not traversing the plates 81. This phase shift is within a range from zero to $2\pi$, depending on the length L and the wavelength $\lambda$ of the light. Since the wavelength $\lambda$ of the laser modes has a random distribution about the peak wavelength $\lambda_0$, the resulting phase shifts which the light from the various laser modes experiences from the optical delay apparatus 27 will also have a random distribution. Therefore, a portion of the light intensities of pulses 95 and 97 indicated as a hatched portion in FIG. 6 generates an interference pattern in the object plane 5 which is different for each coherence cell such that a random averaging takes place. Thus, a second effect of the optical delay apparatus 27 is to introduce random phase shifts between first and second partial beams for further reducing the intensity modulation in the object plane.

With the optical delay apparatus as illustrated above, it is possible to reduce a coherence of the laser light to such an extent that the intensity modulation in the object plane, and, thus, in an image plane, of the projection exposure system due to speckles is as low as 1%.

According to a further embodiment, an optical delay apparatus as shown in FIG. 5 is disposed in the beam 25, wherein the length L of the plates 81 is increased to generate substantially greater optical delays or optical path length differences $\Delta L$ which are greater than $\Delta \lambda_0^2 / 2 \cdot \Delta \lambda_{lat}$, such that a substantial overlap between lines 95 and 97 in FIG. 6 does no longer occur. Even without such overlap, this embodiment significantly contributes to reducing a speckle contrast in the object plane since the number of laser modes which will not interfere with each other is increased.

According to a still further embodiment, plural optical delay apparatuses of the type illustrated in FIG. 5 are disposed in the beam path of beam 25. For example, a first optical delay apparatus 27 may be disposed upstream of a second optical delay apparatus 27 in the beam 25. The first and second delay apparatuses may have different orientations of their plates 81 relative to the beam 25. For example, the first delay apparatus may have its plates 81 oriented in a horizontal direction as illustrated in FIG. 5, and the second delay apparatus may have its plate 81 oriented in a vertical direction.

According to a further example, both the first and second optical delay apparatuses have their plates oriented in a same direction, wherein the plates of the second delay apparatus are laterally displaced relative to the plates of the first optical delay apparatus. Thus, portions of the laser light of the beam will traverse only plates of the first optical delay apparatus, other portions of the beam will traverse only plates of the second optical delay apparatus, other portions will traverse plates of both the first and second optical delay apparatus, and still other portions of the beam will traverse none of the plates of the first and second optical delay apparatuses.

Still further, it is possible that the first and second optical delay apparatuses have plates of different lengths L.

Figure 7:
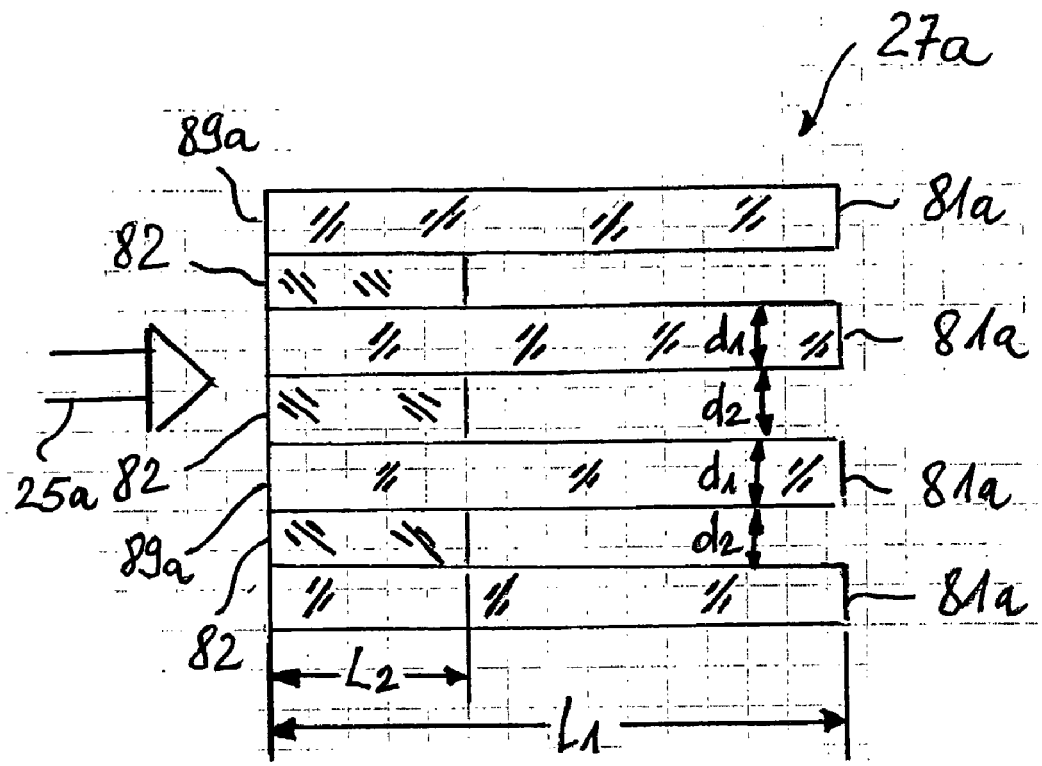
FIG. 7 is a sectional view of a further embodiment of an optical delay apparatus which may be used in the beam delivery system of the projection optical system shown in FIG. 1.

FIG. 7 illustrates a further embodiment of an optical delay apparatus 27*a* which may be used in the beam delivery system.

The optical delay apparatus 27*a* has a similar configuration as that shown in FIG. 5, such that a plurality of parallel glass plates 81*a* having a thickness $d_1$ disposed at a distance $d_2$ from each other. The plates 81*a* have a length $L_1$ in a direction of an incident beam 25*a*. Further, glass plates 82 having a thickness $d_2$ are sandwiched between adjacent plates 81, wherein front surfaces of the plates 82 are registered with front surfaces 89*a* of the plates 81*a*. The plates 82 have a length $L_2$ in the direction of the beam 25*a* which is less than the length $L_1$ of the plates 81*a*. The lengths $L_1$ and $L_2$ are dimensioned such that the desired optical delay $l_m$ is generated, such that $L_1$ and $L_2$ fulfill the relation:

$$l_m = L_1(n_1-1) - L_2(n_2-1),$$

wherein $n_1$ is a refractive index of the material of the plates 81*a*,
$n_2$ is a refractive index of the material of plates 82, and
wherein a refractive index of the gas or vacuum disposed in the void spaces between adjacent plates 81 is assumed to be 1 for simplicity.

Further, the material of plates 82 may have a higher extinction due to such as absorption and scattering for the laser light as compared to the extinction of the material of plates 81*a*. The lengths $L_1$ and $L_2$ are further determined such that both first partial beams traversing the plates 81*a* and second partial beams traversing the plates 82 experience a substantially same extinction when traversing the optical delay apparatus 27*a*.

Figure 8:
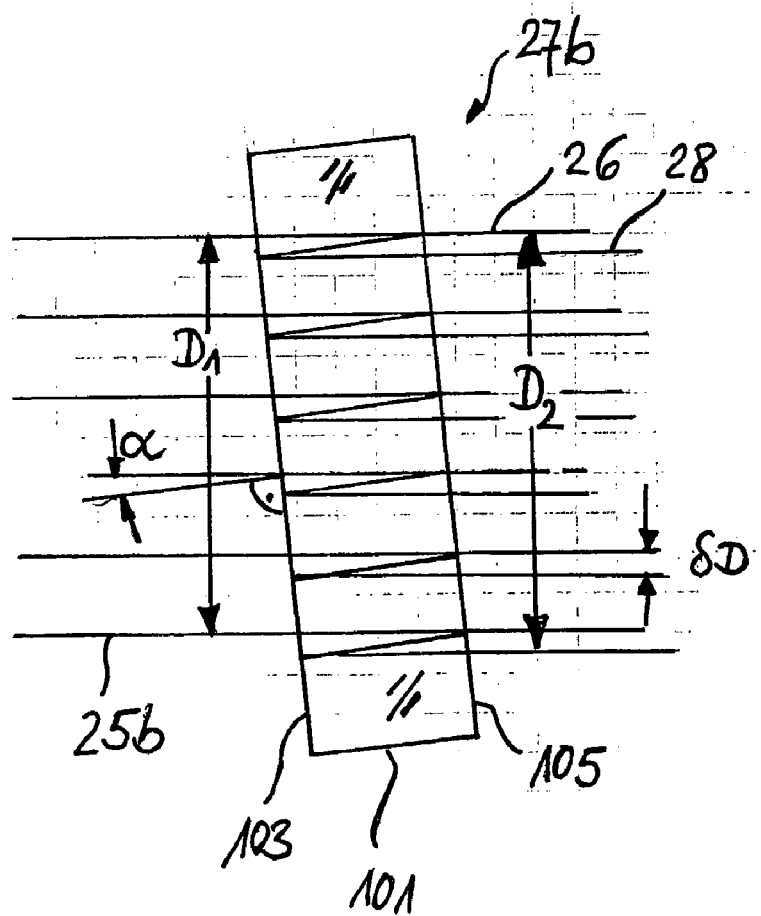
FIG. 8 is a sectional view of a further embodiment of an optical delay apparatus which may be used in the beam delivery system of the projection optical system shown in FIG. 1.

FIG. 8 illustrates a further embodiment of an optical delay apparatus 27*b*. The optical delay apparatus 27*b* comprises a glass plate 101 having a first main surface 103 and a second main surface 105 parallel to surface 103. Surface 103 is oriented transversely in a beam 25*b* of incident laser light, wherein a surface normal of surface 103 is oriented under an angle $\alpha$ relative to the direction of the incident beam 25*b*. The surface 105 is a semi-transparent surface separating the incident beam 25*b* into a first beam 26 directly traversing the plate 101, and a second partial beam 28 which is reflected from surface 105 and thereafter reflected from surface 103 and then traverses surface 105 to be superimposed with beam 26. A thickness d of the plate 101 is chosen such that the partial beam 28 experiences a delay $\Delta l = \lambda_0^2 / (2\Delta\lambda_{lat})$ relative to partial beam 26:

$$d = \frac{\Delta l}{2n},$$

wherein
n is a refractive index of a material of plate 101.

Due to the angle $\alpha$, the partial beam 28 is laterally displaced by an amount $\delta D$ relative to the partial beam 26. Such displacement further contributes to reducing the modulation of an interference pattern generated by light of partial beam 28 interfering with light of partial beam 26.

The displacement $\delta D$ is advantageously determined based on a lateral extension of a lateral mode. According to a first example the angle $\alpha$ fulfills the relation $$0.5 \cdot \arctan \frac{D_1}{d \cdot \sqrt{N_{lat}}} < \alpha < 5 \cdot \arctan \frac{D_1}{d \cdot \sqrt{N_{lat}}}.$$

According to further examples, the angle $\alpha$ fulfills the relation $$0.7 \cdot \arctan \frac{D_1}{d \cdot \sqrt{N_{lat}}} < \alpha < 2 \cdot \arctan \frac{D_1}{d \cdot \sqrt{N_{lat}}}, \text{ or}$$

$$0.8 \cdot \arctan \frac{D_1}{d \cdot \sqrt{N_{lat}}} < \alpha < 1.5 \cdot \arctan \frac{D_1}{d \cdot \sqrt{N_{lat}}}.$$

Compared to a diameter $D_1$ of the incident beam 25*b*, a diameter $D_2$ of combined partial beams 26, 28 is increased only by the small value $\delta D$.

Figure 9:
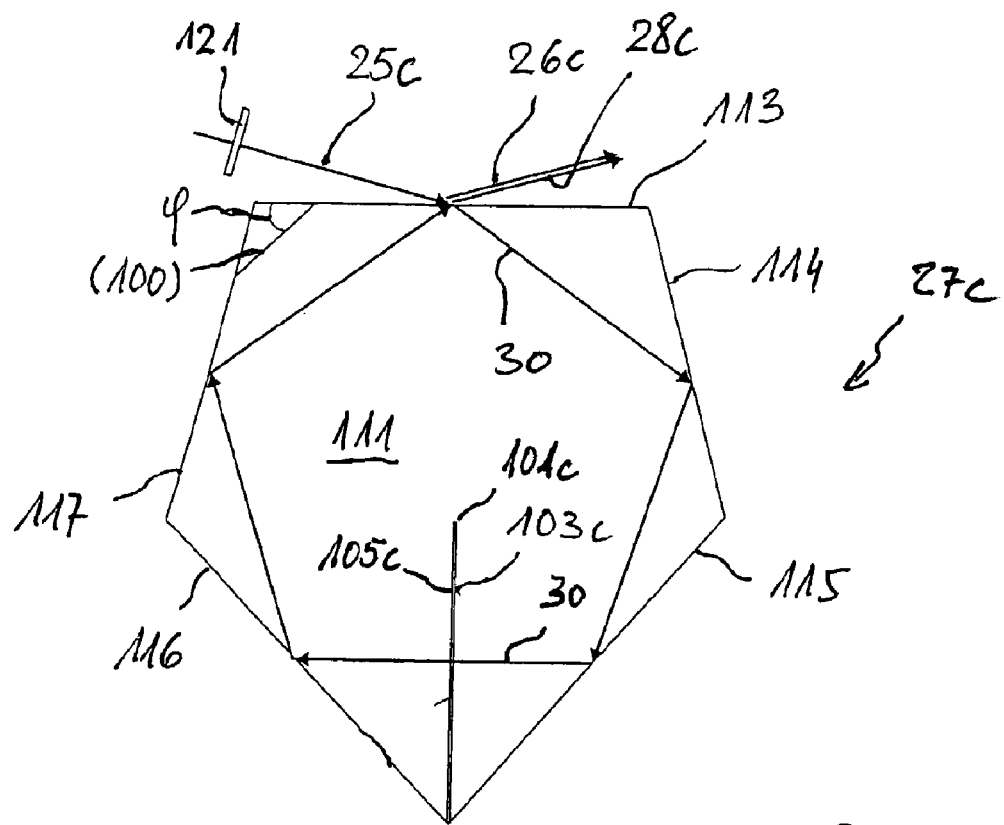
FIG. 9 is a sectional view of a further embodiment of an optical delay apparatus which may be used in the beam delivery system of the projection optical system shown in FIG. 1.

FIG. 9 shows a further embodiment of an optical delay apparatus 27c. The optical delay apparatus 27c comprises a prism 111 having five surfaces 113, 114, 115, 116 and 117. Surface 113 is a semitransparent surface separating an incident beam 25c into a first partial beam 26c directly reflected from the surface 113 of the prism 111, and a second partial beam 30 which is refracted at the surface 113 and enters the bulk material of the prism 111. Beam 30 is subsequently reflected from surfaces 114, 115, 116 and 117 of the prism 111 by internal reflection, and is then again incident on surface 113 from the interior of the prism 111. A portion of that beam traverses surface 113 and coincides as a delayed beam 28c with beam 26c directly reflected at surface 113. A beam path of beam 30 forms a closed loop within prism 111.

The prism 111 may be made of a $CaF_2$ material having a crystal orientation such that a (100) crystal plane is oriented under an angle $\phi$ of 45° relative to the surface 113. Such crystal orientation has an advantage in that an intrinsic birefringence of the material has a reduced effect on the beam 30 traversing the material. If the light of incident beam 25c is polarized by a polarizer 121, such as a half wave plate 121, the delayed beam 28c has a substantially same polarization as the directly reflected beam 26c.

A further plate like phase changing element 101c is disposed in the beam path of beam 30 traversing the prism 111 such that beam 30 is substantially orthogonally incident on a surface 103c of plate 101c.

Figure 10:
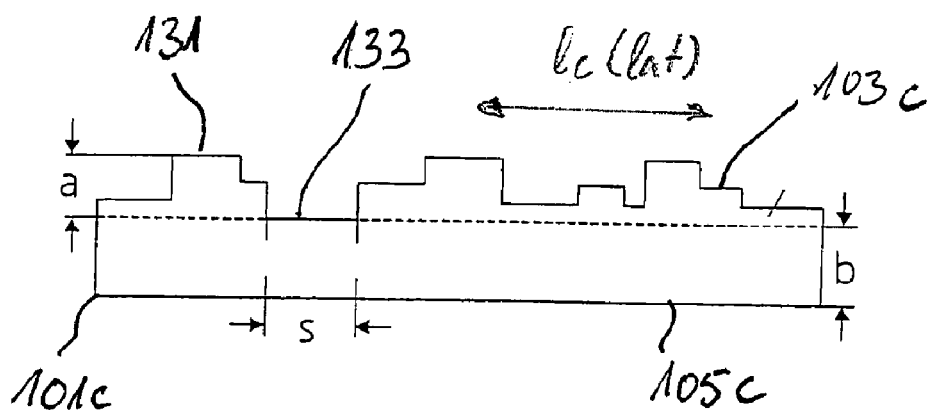
FIG. 10 is a sectional view of a phase changing element of the optical delay apparatus shown in FIG. 9.

FIG. 10 schematically shows a portion of an enlarged section of plate 101c. Structured surface 103c of plate 101c is a stepped surface such that projections 131 and indentation 133 are formed and a thickness of the plate 101c varies across the surface. A minimum thickness is b and a maximum thickness is b+a. Step portions of equal thickness have a lateral dimension of s. Both the height a of the steps and the width s of the step portions varies across the surface of plate 101c. In the illustrated example, the width s is within a range from 0.1 to 5.0 times a lateral extension $l_{c(lat)}$ of a lateral laser mode in the beam 30 traversing the plate 101c. The maximum height a of the stepped portions can amount to some plural wavelengths of the laser light. For example, the value of the height a may be in a range from 200 to 500 nm or as high as some μm. The projections 131 and indentations 133 can be manufactured by lithographic methods, for example.

Further, the distribution of the individual heights of the stepped portion and their widths s can have a random distribution such that also the phase changing effect of plate 101c is a random effect across the cross section of beam 28c.

The structured surface 103c has an effect that wavefronts of the laser light traversing the surface 103c experience minute deformations resulting in minute changes of propagation directions of the light having traversed the surface 103c. If this light traverses the surface 113 to coincide with the beam 26c directly reflected from the surface 113, it will not be exactly coincident with the directly reflected light. Thus, the combined beams 26, 28 include light generated by same longitudinal laser modes but propagating in slightly different directions. This results in different speckle patterns in the object plane disposed downstream of the optical delay apparatus. Due to the enlarged number of different speckle patterns, the uniformity of the light distribution in the object plane will be significantly increased.

Moreover, since a portion of the light of the beam 30 having traversed the structured surface 103c a first time will be reflected from the surface 113 and traverse the structured surface 103c a second time. This results in a further phase changing effect on that light. A portion of that light will traverse the semitransparent surface 113 and be combined with beam 26c, and a further portion of that light will be reflected from surface 113c and experience still further phase changing effects by traversing the structured surface 103c, and so on.

Figure 11:
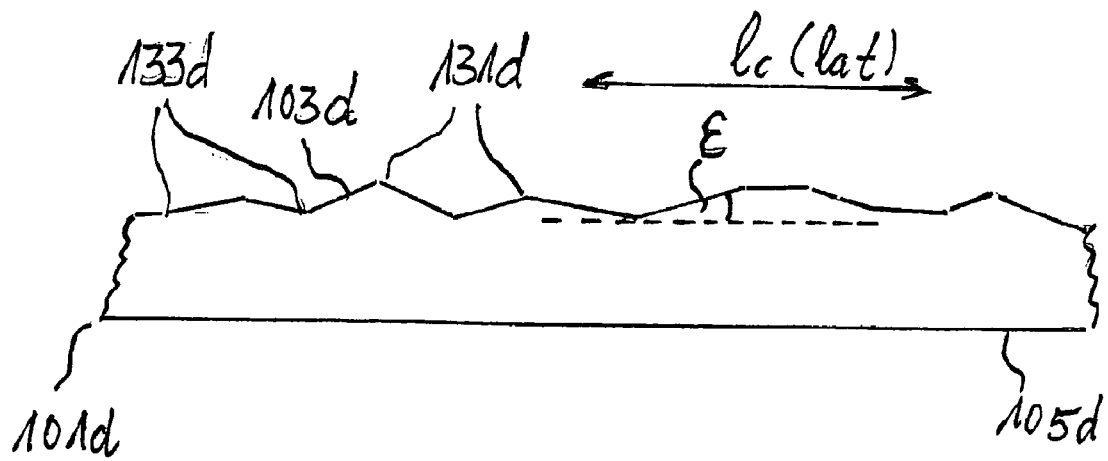
FIG. 11 is a sectional view of a further example of a phase changing element which may be used in the optical delay apparatus shown in FIG. 9.

FIG. 11 schematically shows a further example of a plate 101d having a structured phase changing surface 103d. The structured surface 103d includes a plurality of projections 131d and indentations 133d. The projections and indentations 131d, 133d form a plurality of small prisms on the plate 101d which will cause wavefront deviations of the laser light traversing the surface 103d. A characteristic dimension or extension of the prisms in a lateral direction on the surface is less than, for example five to ten times less than, a lateral extension Lc(lat) of a portion of laser light originating from a same longitudinal laser mode. Inclination angles $\epsilon$ of surface portions of the prisms relative to a main surface direction of the surface 103d may randomly vary from prism to prism. Still further amplitudes or height differences between projections 131d and indentations 133d may randomly vary from prism to prism.

In the embodiment shown in FIG. 9, the phase changing surface 103c is traversed by the beam 30. It is, however, possible that the structured phase changing surface is used as one of the reflecting surfaces 113, 114, 115, 116 and 117 such that the beam interacting with the structured surface is reflected there from.

Figure 15:
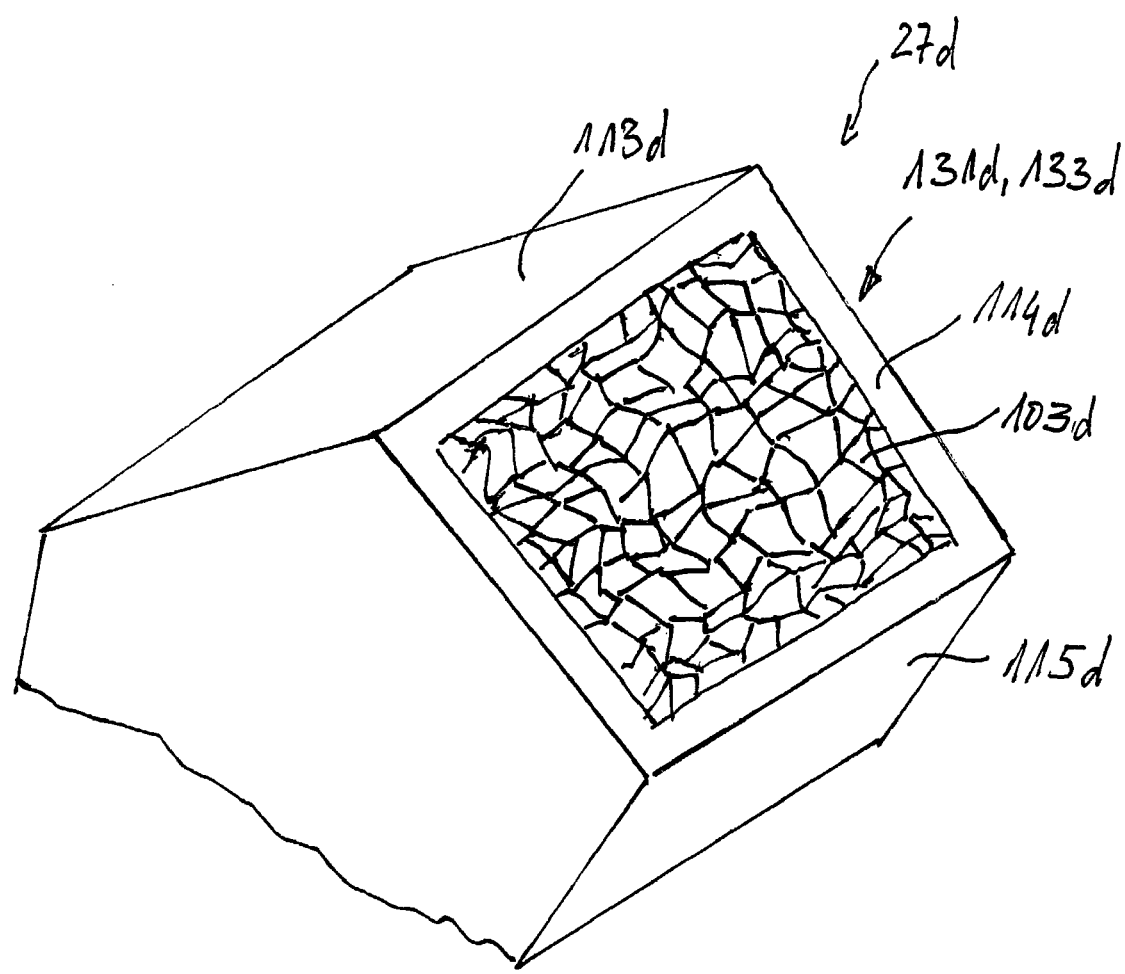
FIG. 15 is a perspective view of a further embodiment of an optical delay apparatus which may be used in the beam delivery system of the projection optical system shown in FIG. 1 or 2.

FIG. 15 is a perspective view schematically illustrating a further embodiment of an optical delay apparatus 27d comprising a prism for providing a closed-loop optical beam path similar to that shown in FIG. 9. In this embodiment, a structured phase changing surface 103d is provided on a reflecting surface 114d of the prism. A beam of light traversing the closed loop is reflected from the structured phase changing surface 103d by internal reflection. The surface 103d is structured by a plurality of projections 131d and indentations 133d forming prisms of random sizes and surface orientations. The representation in FIG. 15 of the projections 131d and indentations 133d is exaggerated with respect to a size of the projections 131d and indentations 133d. In practice, the projections 131d and indentations 133d are of a small size with characteristic lateral extensions which are less that lateral extensions of coherence cells of the laser light incident on and reflected from the structured surface.

Figure 12:
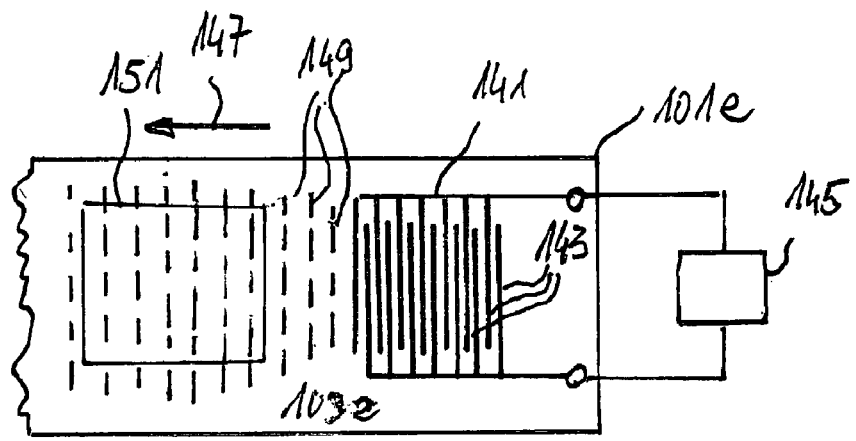
FIG. 12 is an elevational view of a further example of a phase changing element which may be used in the optical delay apparatus shown in FIG. 9.

FIG. 12 is an elevational view of a reflective phase changing surface wherein the structure of the reflective surface is generated by surface acoustic waves. For this purpose, a surface wave generator 141 including a plurality of interdigital electrodes 143 is provided on the surface 103e and connected to a high-frequency generator 145. The substrate material of the plate 101e providing the surface 103e is made of a piezoelectric material such that a high-frequency voltage generated by the high-frequency generator 145 produces surface acoustic waves propagating in a direction 147 across surface 103e. Broken lines 149 in FIG. 12 illustrate wavefronts of the surface acoustic waves, and a rectangle 151 in FIG. 12 illustrates a portion of surface 103e in which the beam 30 is incident on the surface 103e and may interact with the surface acoustic waves 149.

Figure 13:
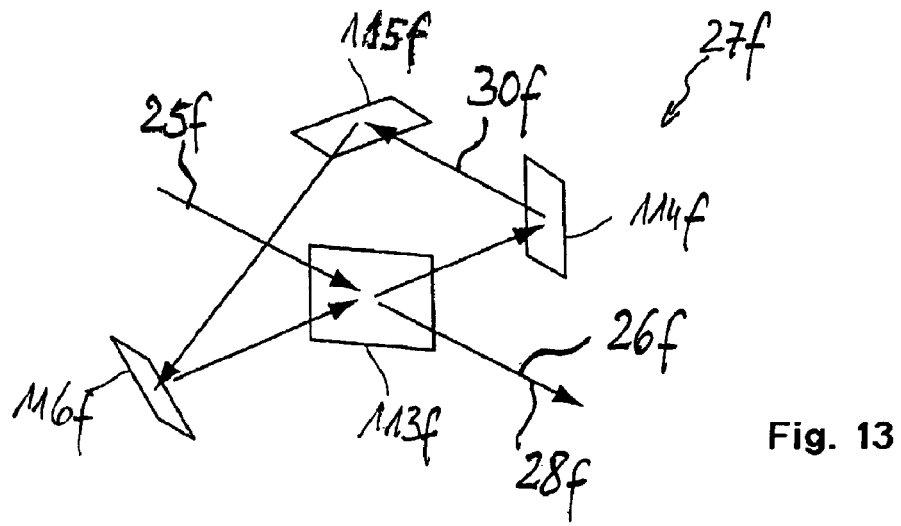
FIG. 13 is a perspective view of a further embodiment of an optical delay apparatus which may be used in the beam delivery system of the projection optical system shown in FIG. 1.

FIG. 13 is a perspective view of a further optical delay apparatus similar to that shown in FIG. 9. The optical delay apparatus 27f shown in FIG. 13 differs from that shown in FIG. 9 in that reflective surfaces 114f, 115f, and 116f are provided by mirrors 114f, 115f, 116f rather than internal reflection surface provided on a prism. A semitransparent surface 113f is provided as a beam splitter on which beam 25f is incident, wherein a portion 26f of that beam traverses the beam splitter 113f and a portion 30f is reflected from the beam splitter 113f. Subsequent reflections from reflective surfaces 114f, 115f and 116f provide a closed loop beam path of beam 30f such that the beam 30f is again incident on the beam splitter 13f. A portion of that beam is reflected from the beam splitter and coincides as beam 28f with beam 26f, whereas another portion of the beam traverses the beam splitter 113f and traverses the closed loop a second time or a greater number of times. Any of the reflective surfaces 114f, 115f and 116f may be formed as a structured surface of the type illustrated with reference to FIGS. 10, 11 and 12 above. Still further, a plate carrying such structured surface can be disposed between any of mirrors 114f, 115f and 116f to generate phase changes when the beam 30f traverses such plate.

Figure 14:
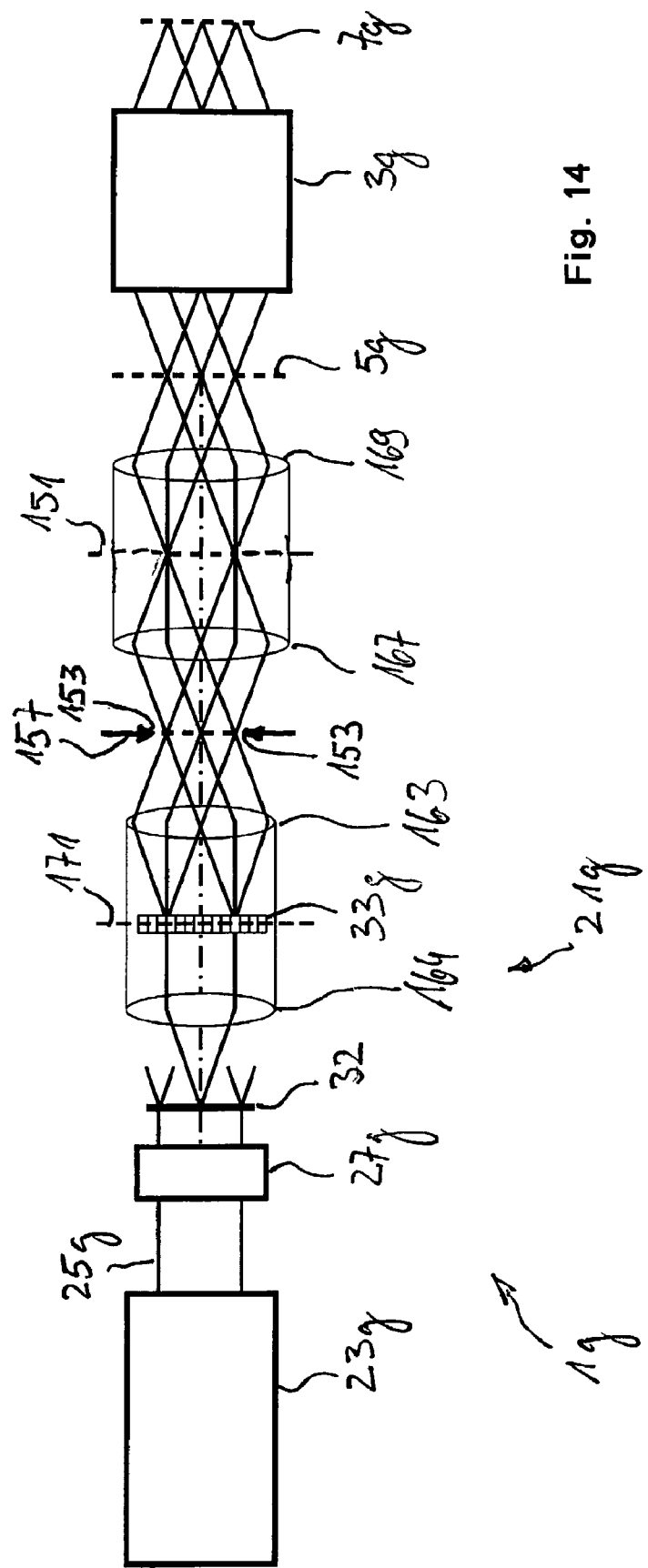
FIG. 14 is a schematic illustration of a projection exposure system according to a further embodiment of the invention.

FIG. 14 is a schematic illustration of a further example of a projection exposure system 1g in which the optical delay apparatus as illustrated above can be incorporated. The projection exposure system 1g comprises a beam delivery system 21g for illuminating an object plane 5g of a projection exposure system 3g such that the object plane 5g is imaged onto an image plane 7g.

The beam delivery system 21g comprises a laser light source 23g, such as an excimer laser. The laser 23g may include a beam expanding optics such that a beam 25g emitted from the light source 23g is already an expanded beam. The beam 25g traverses an optical delay apparatus 27g of the type illustrated above for reducing a coherence of the laser light to reduce a speckle contrast generated in the object plane 5g and in the image plane 7g, accordingly.

The laser light having traversed the optical delay apparatus 27g traverses a pupil shaping diffuser 32 which may be provided by a diffraction grating, such as a computer generated hologram (CGH) to define a shape and light distribution in a pupil plane 171 generated by a condenser lens 164.

A flies eye integrator 33g is disposed in the pupil plane 171. The light having traversed the flies eye integrator 33g traverses a lens or lens system 163 such that a field plane 157 is provided downstream of lens 163. Field plane 157 is imaged onto the object plane 5g of the projection optical system 3g by a reticle masking lens system 167, 169. A field stop 153 is disposed in field plane 157 for defining that portion of the object plane 5g which is illuminated with the laser light. Since the optical delay apparatus 27g of the type as illustrated above is disposed in the beam path of the laser light, a speckle contrast generated in the object plane 5g is effectively reduced to an amount which may be less than 2% or 1%.

According to further embodiments, an optical delay apparatus as shown in any of FIGS. 5, 7 and 8 can be disposed in a beam path of a type shown in FIG. 9, i.e. disposed in a closed loop path formed by plural reflective surfaces. It should be noted that the number of five reflections illustrated in combination with the prism 111 in FIG. 9 is only an exemplary number. It is also possible to use a lower number of reflections, such as three or four reflections, or a higher number of more than five reflections by suitably adjusting the relative angles of the reflecting surfaces. Still further, it is also possible to dispose the plate like phase changing element shown in FIG. 10 in the beam path of the beam delivery system outside of a closed loop. For example, the plate like phase changing element shown in FIG. 10 may be disposed as the optical delay apparatus 27 in the beam delivery system shown in FIG. 1.

It is envisaged to combine each of the above illustrated embodiments with any other of the above illustrated embodiments such that a combined embodiment may comprise one or more features from one of the above illustrated embodiments and one or more features of another of the above illustrated embodiments.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A method of generating a beam of light, comprising:
   exciting a plurality of longitudinal laser modes and combining light generated by the plurality of longitudinal laser modes to form a first beam of laser light, each of the plurality of longitudinal laser modes being excited in the same cavity of a laser;
   separating the first beam of laser light into at least one first partial beam and at least one second partial beam; and
   combining the at least one first partial beam and the at least one second partial beam to form a second combined beam of laser light traversing a beam shaping optics to be incident on an object plane;
   wherein for each of the plurality of longitudinal laser modes:
   a) separating and combining includes separating light of the longitudinal laser mode into at least first and second separated light portions and differently manipulating the first and second separated light portions,
   b) differently manipulating the first and second separated light portions includes generating an optical delay between the first and second separated light portions, and
   c) the optical delay has a length such that the first and second separated light portions have a temporal overlap.

2. The method according to claim 1, wherein at least one of the first partial beam and the second partial beam interacts with a plurality of phase changing structures having characteristic lateral extensions transversely to the at least one of the first partial beam and the second partial beam which is smaller than a lateral extension of a light portion originating from a single longitudinal laser mode in the at least one of the first partial beam and the second partial beam.

3. The method according to claim 2, wherein differently manipulating the separated first and second separated light portions includes generating a difference in a direction of propagation of the first separated light portion relative to the second separated light portion.

4. A method of generating a beam of light, comprising:
   exciting a plurality of longitudinal laser modes in a cavity of a laser and combining light generated by the plurality of longitudinal laser modes to form a first beam of laser light, wherein the light generated by single longitudinal laser modes of the plurality of longitudinal laser modes has an average first line width, wherein the laser light of the combined first beam has, at each of respective lateral positions of the first beam, a second line width corresponding to a lateral laser mode, wherein the laser light of the combined first beam has, when averaged over a whole cross section thereof, a third line width corresponding to plural lateral laser modes, wherein the second line width is greater than the first line width, and wherein the third line width is greater than the second line width;

separating the first beam of laser light into at least one first partial beam and at least one second partial beam;

providing an optical path difference of the at least one first partial beam relative to the at least one second partial beam; and combining the at least one first partial beam and the at least one second partial beam to form a second combined beam of laser light; and wherein the following relation is fulfilled:

$$0.8 \cdot \frac{\lambda_0^2}{(2 \cdot \Delta \lambda_l)} < \Delta l < 1.8 \cdot \frac{\lambda_0^2}{(2 \cdot \Delta \lambda_l)},$$

wherein $\Delta l$ represents the optical path difference, $\lambda_0$ is an average wavelength of the light of the first beam of laser light, and $\Delta \lambda_l$ represents the second line width.

5. The method according to claim 4, wherein the combining of the at least one first partial beam and the at least one second partial beam is performed such that cross sections of the at least one first partial beam and the at least one second partial beam are disposed adjacent to each other within a cross section of the combined second beam.

6. The method according to claim 5, wherein plural first partial beams and plural second partial beams are combined to the combined second beam such that cross sections of the first partial beams and the second partial beam are alternatingly disposed adjacent to each other within the cross section of the combined second beam.

7. The method according to claim 4, wherein the combining of the at least one first partial beam and the at least one second partial beam is performed such that a beam path of the at least one first partial beam is laterally displaced relative to a beam path of the at least one second partial beam.

8. The method according to claim 7, wherein the beam path of the at least one first partial beam is laterally displaced relative to the beam path of the at least one second partial beam by more than a tenth of a distance corresponding to a width of a lateral laser mode across a cross section of the first beam of laser light.

9. The method according to claim 7, wherein the beam path of the at least one first partial beam is laterally displaced relative to the beam path of the at least one second partial beam by less than a distance corresponding to a width of a lateral laser mode across a cross section of the first beam of laser light.

\* \* \* \* \*

UNITED STATES PATENT AND TRADEMARK OFFICE
CERTIFICATE OF CORRECTION

| | | |
|---|---|---|
| PATENT NO. | : 7,995,280 B2 | Page 1 of 1 |
| APPLICATION NO. | : 11/792099 | |
| DATED | : August 9, 2011 | |
| INVENTOR(S) | : Matthias Kuss | |

It is certified that error appears in the above-identified patent and that said Letters Patent is hereby corrected as shown below:

Column 1,
Line 14, delete "2004." and insert --2005.--

Signed and Sealed this
Fourth Day of October, 2011

David J. Kappos
*Director of the United States Patent and Trademark Office*